US006643324B1

(12) United States Patent
Gasparik (10) Patent No.: US 6,643,324 B1
(45) Date of Patent: Nov. 4, 2003

(54) PAD CELL CIRCUIT-INTEGRATED, DIFFERENTIAL-SIGNAL EQUALIZATION RECEIVER FOR INTEGRATED CIRCUIT AND METHOD OF BOOSTING AND EQUALIZING HIGH FREQUENCY DIFFERENTIAL SIGNALS

(75) Inventor: Frank Gasparik, Monument, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/567,203

(22) Filed: May 8, 2000

(51) Int. Cl.[7] .......................... H03H 7/30; H04L 27/06
(52) U.S. Cl. ........................... 375/229; 375/316
(58) Field of Search ...................... 375/229, 230, 375/332, 257, 258, 316, 318; 327/274, 266; 333/28 R, 24 R; 360/65; 708/323, 400, 322

(56) References Cited

U.S. PATENT DOCUMENTS 5,894,468 A * 4/1999 Kimura et al. ............... 360/46
5,943,177 A * 8/1999 Mathews et al. ............. 360/65
6,300,816 B1 * 10/2001 Nguyen ...................... 327/407
6,307,424 B1 * 10/2001 Lee .............................. 327/530

* cited by examiner

Primary Examiner—Don N. Vo
Assistant Examiner—Khai Tran
(74) Attorney, Agent, or Firm—Ortiz & Lopez, PLLC (57) ABSTRACT

An equalization receiver responds to two differentially-related digital input signals occurring at a predetermined communication frequency. First and second input devices respond to the input signals and supply drive signals of a magnitude amplified relative to input signal by a factor related to the current conducted by the input devices. First and second current separate sources are connected to conduct current through the first and second input devices. An equalization circuit is connected between the first and second current sources. The equalization circuit has a frequency dependent impedance characteristic which exhibits a minimum impedance and a maximum coupling of the first and second current sources for the greatest current conductivity and the greatest amplification at the predetermined frequency. The greater amplification creates a more amplified output signal which compensates for the high frequency filtering and attenuation characteristics of the cable at higher frequencies but allows the digital signals to remain relatively unaffected at lower frequencies where the cable exhibits relatively insignificant filtering and attenuation characteristics. The method of the present invention achieves related and similar functionality.

24 Claims, 3 Drawing Sheets

PAD CELL CIRCUIT-INTEGRATED, DIFFERENTIAL-SIGNAL EQUALIZATION RECEIVER FOR INTEGRATED CIRCUIT AND METHOD OF BOOSTING AND EQUALIZING HIGH FREQUENCY DIFFERENTIAL SIGNALS

This invention relates to a high frequency digital signal receiver for an integrated circuit (IC), and more particularly to a new and improved equalizer receiver having size and power requirements which allow it to be integrated into the IC, preferably as a part of a pad cell circuit of the IC. The new and improved equalizer receiver and its method combine the beneficial effects of gain enhancement and frequency equalization to reliably detect relatively high frequency digital signals while overcoming the adverse affects from initial symbol interference (ISI) of signals communicated over a cable, without requiring a separate equalizer and/or amplifier as added components to the IC.

BACKGROUND OF THE INVENTION

Modern digital communications systems require the transmission and reception of digital signals at a relatively high rate. The digital signals are high-level and low-level voltages, each of which is a "bit," and the rate of communication of the digital signals is measured in terms of bits per second (bps). The present bps rate of communication internally between a processor and its bus-connected components within modern personal computers is typically in the range of 100–600 Mbps. Such high internal communication frequencies are possible because of relatively short communication paths, tight control over the characteristics of the signals and the communication paths, and the use of coordinated system components which are designed to interact with one another in a specific manner at high communication rates.

Relatively high digital signal communication rates become more problematic, however, when dealing with peripheral equipment connected by cables to the internal processor and bus-connected components. Examples of peripheral equipment connected by cables include disk drives, memories with mechanical components associated with their-media storage, and other computers which are connected by cabling or by a local area network. For cable connections, certain standards have been enacted to enhance the uniformity of signal communication, thereby facilitating the interconnection of various components. One well-known standard associated with cabling is a standard known as small computer system interface (SCSI). The SCSI standard requires that signals delivered have certain voltage levels, exhibit certain waveform characteristics with respect to time and otherwise comply with a variety of other requirements. For local area network connections, such as ethernet, certain protocols and standards have also been enacted which specify the characteristics of the signals and thereby enhance the ability for diverse and unspecified computer equipment to interact with each other over the local area network.

In both cable and local area network connections, difficulties in achieving high frequency communication rates arise which are not present in communication between the processor and its bus-connected elements. The cable itself attenuates the signals, thereby diminishing the signal strength, particularly if the length of the cable is significant. It is not unusual for a SCSI cable to extend a number of feet or meters, and it is typical of that local area network cables extend many tens of feet or meters. Enough attenuation of a digital signal will result in it being mistaken for a digital signal having the opposite value (high or low voltage).

Because the cable itself is a complex impedance having both inductance and capacitance, the signal transmission characteristics of the cable are frequency-dependent. The cable itself filters and blocks the high frequency components of the digital signals but usually passes low frequency signals without difficulty. As a consequence, the relatively rapid transition of a digital signal between the high and low levels is changed by the cable to a more gradual transition. A sharp transition is achieved by passing high frequency components of the signal, but those high frequency components are blocked by the high frequency filtering characteristics of the cable itself. A gradual transition of the signal is undesirable because it affords the possibility that the voltage level of the digital signal will be mistaken for the opposite value as a result of the gradual transition. To avoid the problem of high frequency attenuation, the communication rate must be reduced, which is counter to the evolution of higher communication rates in modern computer systems.

A further significant problem with the high communication rates over a relatively lengthy cable is initial symbol interference (ISI). In simple terms, ISI is in adverse influence on a presently occurring digital signal as a result of the previous digital signals which have been communicated over the cable. The residual affects from previous signals adversely influence the present signal. The previous signals have charged or otherwise influenced the capacitance of the cable, so that a transition of the present digital signal must overcome the previous charge on the cable. For example, if a series of low-voltage level digital signals had been communicated over the cable, the cable is relatively discharged. The occurrence of a high-level signal will necessitate charging the cable. The time taken to charge the cable will diminish the value of the present digital signal until the cable becomes charged to the high voltage level of the present signal. The necessity to charge the cable may result in mistaking the present digital signal for its opposite value. In very high frequency communication systems, more than one of the previous digital signals have residual ISI influences, although the residual affect diminishes with each subsequent digital signal.

Local area network communications systems have solved many of the attenuation, frequency filtering and ISI problems by employing pre-compensation or pre-emphasis driver circuits and equalization receiver circuits connected at both ends of the cables which form the communication media of such local area networks. A pre-compensation or pre-emphasis driver circuit boosts the signal level or amplitude of each transitional digital signal applied on the cable. For example, after a series of low-voltage level digital signals applied to the cable, the first high-voltage level digital signal will be boosted in magnitude by some appropriate margin, for example 30 percent. The boosted magnitude of the transition signal tends to overpower the effects of ISI and attenuation. An equalization receiver circuit connects complex impedance elements to the cable to cause a tuned or peaked frequency response at the desired high frequency communication rate. Equalization overcomes the high frequency filtering characteristics of the cable by providing a peaked or enhanced response at the frequency of the communication rate.

Local area networks also successfully use differential signaling to overcome adverse influences. Differential signaling involves a pair of conductors whose individual signals move in relatively opposite directions with respect to one another. The difference in signal level determines the digital signal value. Noise induced into the cable has a minimal effect, because the noise equally influences the signal levels on both conductors, thereby canceling or rejecting those adverse influences.

The use of pre-compensation, pre-emphasis, equalization and differential signaling circuits in local area networks is acceptable, because it is relatively easy to accommodate these additional separate components to each end of the single connecting cable. However, difficulties arise in the context of a SCSI cable or other internal multiconductor computer cable were it is necessary to connect the SCSI or other cable to the ICs contained within the computer itself. In these situations, to build a pre-compensation or pre-emphasis driver circuit as a part of an IC would consume a large surface of the chip upon which the IC is fabricated. Since the frequency response characteristics of a pre-compensation or pre-emphasis driver circuit which uses operational amplifiers and operational transconductance amplifiers is directly related to the power consumed by these amplifiers, conventional pre-compensation and pre-emphasis driver circuits require large sized components on the IC. The larger components diminish the chip area available for incorporating core functional elements on the IC, thereby diminishing the overall functionality of the IC. Moreover, SCSI standards require much higher signaling voltage levels than are used in modern ICs. The SCSI standard for signals specifies a 5 volt tolerance, but modern ICs operate at approximately 1.8 volts in order to reduce power consumption. Therefore, changing the signal level between 1.8 volts IC level and a 5 volt SCSI level further requires additional components on the IC itself, which further consumes space on the IC and diminishes its overall functional capability. Lastly, the pad cell circuits around the periphery of a modern IC are already occupied by a variety of important signal conditioning circuitry, all of which is intended to shape and otherwise condition the signals delivered from or received at these pads. Indeed, in some modern ICs, the pad cell circuitry is so extensive that the internal space within the IC is substantially diminished for the incorporation of core logic circuitry, which already reduces the overall functionality of the IC.

As a consequence of these and other factors, there exists a substantial problem of incorporating circuitry on an IC itself which will allow high frequency digital signal communication over cables, such as SCSI cables, without the use of numerous, substantially-sized separate components. It is with respect to these and other background considerations that the present invention has evolved.

SUMMARY OF THE INVENTION

An important aspect of the present invention is the incorporation in an IC of gain boosting and equalization receiver circuitry in a manner which allows the IC to directly communicate with the cable at relatively high bit rates. Another aspect of the invention relates to incorporating a gain boosting and equalization receiver circuit of a relatively small size in an IC, and preferably in the pad cell circuits of the IC, in a manner which does not consume excessive space, which does not require excessive power consumption, and which will operate effectively at the lower voltage levels which power the IC but which will still respond to the relatively higher signal voltages delivered from the cable in accordance with existing communication standards such as the SCSI standards. Another aspect of the present invention involves the incorporation of a gain boosting and equalization receiver circuit in an IC which is capable of operating at relatively high frequencies but which is also capable of backwards-compatible communication at lower frequencies to enable effective communication with the older, legacy communication equipment which is only capable of lower communication rates. A further aspect of the present invention involves a gain boosting and equalization high frequency receiver circuit having size characteristics capable of its use and incorporation with a multi-conductor cable, such as a SCSI cable, which may contain many separate signal channels, for example 27, without consuming excessive space or power.

To achieve these and other new and improved aspects, the present invention comprises an equalization receiver circuit which responds to two differentially-related digital input signals occurring at a communication rate of a predetermined frequency. A first input device of the equalization receiver responds to one input signal and supplies a first drive signal of a magnitude amplified relative to the one input signal by a factor related to the current conducted by the first input device. A first current source is connected to conduct current through the first input device. A second input device responds to the other input signal and supplies a second drive signal of a magnitude amplified relative to the other input signal by a factor related to the current conducted by the second input device. A second current source is connected to conduct current through the second input device. The first and second current sources are separate from one another. A differential amplifier responds to first and second drive signals to supply an output signal related to the relative difference in magnitude of the first and second drive signals. An equalization circuit is connected between the first and second current sources. The equalization circuit has a frequency dependent impedance characteristic which exhibits a minimum impedance and a maximum coupling of the first and second current sources for the greatest current conductivity and hence, the greatest amplification of the relative magnitudes of the first and second drive signals by the first and second input devices, at the predetermined frequency. The more amplified relative magnitudes of the first and second drive signals cause the differential amplifier to deliver a more amplified or boosted output signal.

A preferred aspect of the equalization receiver circuit includes a diminished responsiveness to the two differentially-related digital input signals occurring at a second predetermined frequency which is different and preferably less than the first predetermined frequency, thereby enabling the equalization receiver to be used with legacy communication equipment. The frequency dependent impedance characteristic of the equalization circuit exhibits a relatively increased impedance and a relatively decreased coupling of the first and second current sources to achieve diminished current conductivity and amplification of the relative magnitudes of the first and second drive signals by the first and second input devices at the second predetermined frequency compared to the current conductivity and amplification at the first predetermined frequency. The diminished amplification of the relative magnitudes of the first and second drive signals at the second predetermined frequency causes the differential amplifier to deliver a diminished output signal at the second predetermined frequency. The responsiveness of the equalization circuit at the first and second predetermined frequencies compensates for the relatively significant high frequency filtering and attenuation characteristics of the cable at the first predetermined higher frequency and allows the digital signals to remain relatively unaffected at the second predetermined lower frequency where the cable exhibits relatively insignificant high frequency filtering and attenuation characteristics.

Other preferred aspect of the equalization receiver relates to its incorporation in an integrated circuit, preferably in a pad cell circuit of the integrated circuit. The cable may be directly connected through intervening connectors to the integrated circuit. Each of the a plurality of communication channels of the cable may be connected to one of the pad cell circuits. Current mirroring devices may be connected to the differential amplifier to conduct current in a mirrored relationship to the output signal from the differential amplifier.

Another preferred aspect of the present invention relates to a method of boosting and equalizing a response to two differentially-related digital input signals occurring at a communication rate of a predetermined frequency over a pair of conductors defining a channel of a multichannel communication cable. The method includes supplying a first drive signal derived from one input signal conducted by one conductor of the pair of conductors of the channel of the cable, amplifying the first drive signal relative to the one input signal by a factor related to a current conducted from a first current source by a first amplifying device, supplying a second drive signal derived from the other input signal conducted by the other conductor of the pair of conductors of the channel of the cable, amplifying the second drive signal relative to the other input signal by a factor related a current conducted from a second current source by a second amplifying device, and coupling the first and second current sources together to achieve a combined current conductivity and the greatest amplification of the relative magnitudes of the first and second drive signals at the predetermined frequency.

Further preferred aspects of the method also involve communicating a response to the two differentially-related digital input signals occurring at a second predetermined frequency which is different from the first predetermined frequency. In this case, the method involves substantially uncoupling the first and second current sources from one another to limit the current conductivity and the amplification of the relative magnitudes of the first and second drive signals at the second predetermined frequency to limit the current conductivity and the amplification compared to that which is available separately from each of the first and second current sources. Other preferred aspects of the method relative to filtering and attenuating the digital signals by communication of the digital signals at the first predetermined frequency over the cable, and communicating the digital signals over the cable without substantial filtering and attenuation at the second predetermined frequency. The steps of the method may also be accomplished by using devices integrated into a complementary metal oxide field effect transistor integrated circuit.

A more complete appreciation of the present invention and its scope, and the manner in which it achieves the above noted improvements, can be obtained by reference to the following detailed description of a presently preferred embodiment of the invention taken in connection with the accompanying drawings, which are briefly summarized below, and the appended claims.

DETAILED DESCRIPTION

Figure 1:
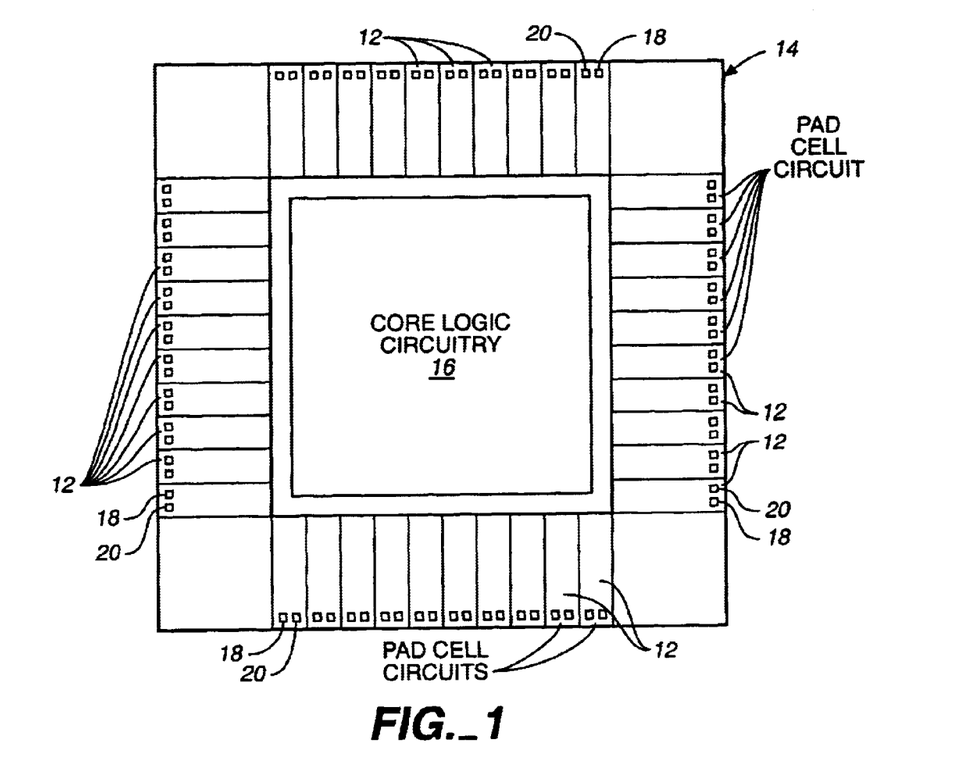
FIG. 1 is a generalized illustration of an integrated circuit (IC) having a plurality of pad cell circuits of which an equalization receiver circuit incorporating the present invention is a part.
Figure 2:
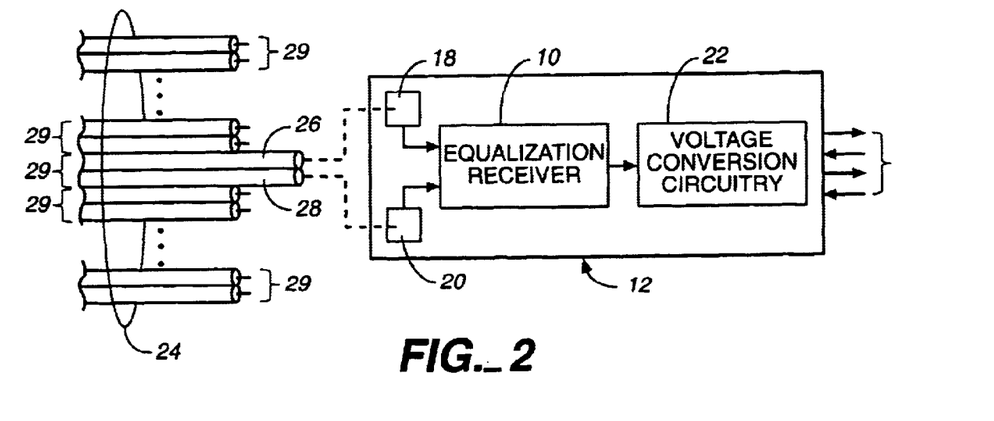
FIG. 2 is an enlarged block diagram of a pad cell circuit of the IC shown in FIG. 1 and a portion of a cable over which high frequency digital signals are communicated to and from the equalization receiver circuit which incorporates the present invention.

An equalization receiver circuit 10 which incorporates the present invention is preferably integrated into each of a plurality of pad cell circuits 12 an integrated circuit (IC) 14, shown in FIGS. 1 and 2. In addition to the pad cell circuits 12, the IC 14 also includes core logic circuitry 16 located within the interior of the chip upon which the IC 14 is formed. The core logic circuitry 16 of the IC 14 refers to all of the functional logic elements (not otherwise specifically shown) of the IC which perform its logic functions. The pad cell circuits 12 include signal pads 18 and 20 upon which signals are received by the IC 14 or from which signals are delivered from the IC 14.

The pad cell circuits 12 condition the signals before they are delivered from the IC or after they are received at the IC. The pad cell circuits 12 typically comprise a large number of functional devices in order to accomplish all of the typical functions of a pad cell circuit, causing the pad cell circuits 12 themselves to consume a significant portion of the area of the chip upon which the IC 14 is formed, as is generally shown in FIG. 1. Furthermore, because of their functionality in transmitting and receiving signals, the pad cell circuits 12 are typically located adjacent to the edges of the chip upon which the IC 14 is formed, as is also shown in FIG. 1. The signal pads 18 and 20 of each pad cell circuit 12 are preferably located at a position adjoining in outer edge of the pad cell circuit at the edge of the chip of the IC, to facilitate attaching leads or conductors from the pads 18 and 20 to pins of the typical package in which the IC 14 is located in a commercial product.

The equalization receiver circuit 10 is preferably connected to and made a part of the pad cell circuit 12, as shown in FIG. 2. In addition to the equalization receiver circuit 10, and the other typical signal conditioning circuitry (not shown) normally included in a pad cell circuit, the pad cell circuit 12 may include a single ended receiver, a single ended driver, and a differential driver (none of which are shown). Each pad cell circuit 12 also includes voltage conversion circuitry 22. The conversion circuitry 22 converts signals supplied from the pad cell circuit 12 to the core logic circuitry 16 (FIG. 1) from the typical pad cell operating voltage of approximately 3.3 volts to the typical operating voltage of the core logic circuitry 16 of approximately 1.8 volts. The converter 22 also operates in the opposite direction, converting the 1.8 volts signals supplied from the core logic circuitry 16 to 3.3 volts used by the pad cell circuit. The typical IC 14 includes the necessary power supply conductors to accommodate the operating voltage of the core logic circuitry 16 and the pad cell circuits 12.

Because the equalization receiver circuit 10 operates on a differential signal basis, it is connected to the two signal pads 18 and 20 of each pad cell circuit 12, as shown in FIG. 2. The two signals which form the difference signal to which the equalization receiver circuit 10 responds are applied to the two pads 18 and 20, usually from pairs of conductors of the cable 24, such as a small computer system interface (SCSI) cable. One pair of conductors 26 and 28 of the cable 24 are shown in FIG. 2 by dashed lines connected to the signal pads 18 and 20 of the pad cell circuit 12. Each pair of conductors (e.g. 26 and 28) forms a channel 29 of the cable 24. In a SCSI cable, up to 27 channels or conductor pairs are present.

As is understood from the dashed lines shown in FIG. 2 connecting the cables 26 and 28 to the signal pads 18 and 20, respectively, each channel 29 of the cable 24 may be directly connected to a different pad cell circuit 12 without the necessity for intervening functional components. Of course, intervening direct electrical connections will be required, but those electrical connections are more easily confined within the limited space between the signal pads 18 and 20 and the pad cell circuits 12 (FIG. 1) than would be possible if functional components such as equalization operational amplifiers and transconductance amplifiers were attempted to be integrated into the pad cell circuits 12 or connected exteriorly of the IC 14 to the pad cell circuits 12.

The ability to achieve the direct connection between the conductors (e.g. 26 and 28) of each channel 29 of the cable 24 is one of the significant advantages of the present invention. By incorporating the equalization receiver circuit 10 as part of the pad cell circuits 12, high frequency signals may be communicated through intervening pin and package leads directly from the cable 24 to the equalization receiver circuit 10, without the necessity for accommodating space-consuming equalization operational amplifiers and transconductance amplifiers either on the chip of the IC or exteriorly of the IC. As a consequence of avoiding these additional and relatively large functional components, the pad cell circuits remain relatively small compared to the core logic circuitry 16, thus achieving and preserving a relatively high degree of functionality from the core logic circuitry 16 of the IC 14. The relatively small size of the equalization receiver 10 avoids the need to diminish the size and hence functionality of the core logic circuitry 16 which would otherwise be required to accommodate additional, space-consuming elements in order to directly communicate signals from the cable 24. All of these important aspects of the circuit 10 are more readily understood by reference to the schematic diagram of the circuit 10, shown in FIG. 3.

Figure 3:
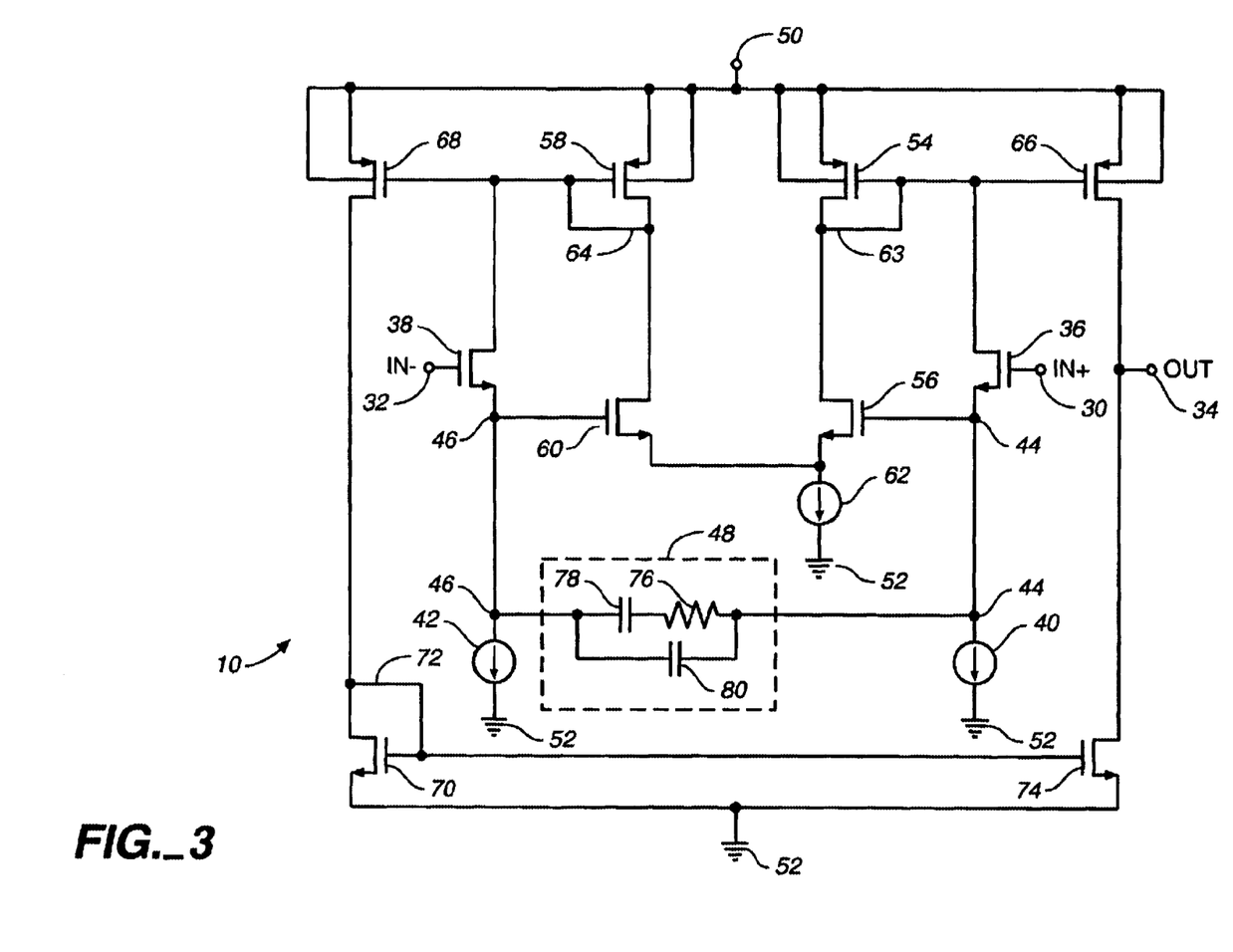
FIG. 3 is a schematic diagram of the equalization receiver circuit shown in FIG. 2.

The equalization circuit 10, shown in FIG. 3, is a differential input, single-ended output circuit. One input signal is applied to a non-inverting input terminal 30 and the other input signal is applied to an inverting input terminal 32. The input signals applied at the terminals 30 and 32 are derived from the conductors 26 and 28 which form one channel 29 of the cable 24, as connected to the signal pads 18 and 20 (FIG. 2). An output signal from the circuit 10 is applied at a single-ended output terminal 34. Because the circuit 10 responds to differential digital signals, the output signal at the terminal 34 will be a digital signal which has a logic high level in response to one relative relationship of the differential input signals at terminals 30 and 32, and which has a logic low level in response to the other relative relationship of the differential input signals. The output signal at terminal 34 transitions between these two levels in response to the relative difference of the input signals at terminals 32 and 34. The ability to achieve a rapid transition from one logic level to the other is directly related to the ability of the circuit 10 to respond to high frequencies and the ability of the circuit 10 to drive sufficient output current into the load connected to the output terminal 34 so as to achieve a high frequency response characteristic.

The enhanced responsiveness of the circuit 10 to high frequencies is achieved by input transistors 36 and 38, current sources 40 and 42 which are connected to source terminals 44 and 46 of the transistors 36 and 38, respectively, and by a high frequency equalization circuit 48 which is also connected between the source terminals 44 and 46 of the input transistors 36 and 38 as well as between the current sources 40 and 42. The remaining components of the equalization circuit 10 comprise a conventional differential amplifier with current mirroring. The use and incorporation of the new components 36, 38, 40, 42 and 48 with the conventional differential amplifier with current mirroring is also a part of present invention.

The input transistors 36 and 38 are preferably conventional N-channel, complementary metal oxide (CMOS) field effect transistors (FETs). The remaining transistors of the equalization circuit 10 are also preferably CMOS FETs. The power to the circuit 10 is applied at terminal 50, and will typically be the pad cell circuit voltage of approximately 3.3 volts. The gate oxide thicknesses of the input transistors 36 and 38 are sufficient to withstand the higher voltage input signals applied from the cable 24 (FIG. 2), which may be as high as 5 volts. Reference potential is present in the circuit at reference terminal 52.

A conventional differential amplifier is formed by a P-channel transistor 54 and a N-channel transistor 56 which are connected at their drain terminals in one of branch of the differential amplifier, and another P-channel transistor 58 and a N-channel transistor 60 connected at their drain terminals in the other branch of the differential amplifier. The gate terminals of the transistors 56 and 60 receive input signals to the differential amplifier, and output signals from the differential amplifier are derived from the commonly-connected drain and gate terminals of each of the transistors 54 and 58. The transistors 56 and 60 respond to drive signals present at the source terminals 44 and 46 of the transistors 36 and 38, respectively. A current source 62 biases the source terminals of the differential input transistors 56 and 60, thereby causing them to conduct oppositely in a coordinated differential manner.

The P-channel transistors 54 and 58 are diode connected, meaning that a common connection 63 and 64 extends between the gate terminals and the drain terminals of the transistors 54 and 58, respectively. As a consequence of the common connections 63 and 64, the P-channel transistors 54 and 58 conduct as much current as is required by the conductivity of the N-channel transistors 56 and 60, respectively, in response to the input signals to the differential amplifier from the source terminals 44 and 46.

The differential amplifier formed by the transistors 54, 56, 58 and 60, and the current source 58, functions in the conventional manner. Each branch of the differential amplifier experiences opposite current conductivity characteristics in response to differential drive signals applied at the input terminals 30 and 32. An increasing signal at terminal 30 will result in an increasing signal the source terminal 44 of transistor 36 which is also applied to the gate terminal of the transistor 56. A corresponding decreasing signal at the terminal 32 will result in a decreasing signal at the source terminal 46 of transistor 38 which is also applied to the gate terminal of the transistor 60. Transistor 56 becomes more conductive, and transistor 60 becomes less conductive. The connected P-channel transistors 54 and 56 of the two branches of the differential amplifier also become more conductive and less conductive, respectively. The constant current characteristics of the current source 62 divide the current between the two branches of the differential amplifier. When the branch formed by transistors 54 and 56 conducts more current, less current is available to be conducted through the branch formed by transistors 58 and 60. The constant current characteristics of the source 62 further ensure that the differential drive signals applied to the transistors 56 and 60 result in the equal and opposite effect in the two branches of the differential amplifier. Of course, the opposite effect occurs from a relatively opposite levels of the differential input signal applied at terminals 30 and 32.

The common connection 63 between the gate and drain terminals of the transistor 54 biases a current mirroring transistor 66 to conduct in the same manner as transistor 54 conducts. The same conductivity characteristics result from the common connection 63 of the gate terminals of transistors 54 and 66 to the drain terminal of the transistor 56. The same conductivity characteristics of transistors 54 and 66 is an effect known as "current mirroring." Because of the current mirroring, transistor 66 delivers current to the output terminal 34 from the power supply terminal 50 to the same extent that transistor 54 conducts current.

The common connection 64 causes and other current mirroring P-channel transistor 68 to experience conductivity characteristics the same as those of the transistor 58. The similar conductivity characteristics of transistors 58 and 68 is a result of the common connection of the gate terminals of both transistors to the drain terminals of transistors 58 and 60. The current mirroring P-channel transistor 68 is connected in series to another current mirroring N-channel transistor 70. The current conducted from the drain terminal of the transistor 68 is also conducted through the transistor 70, as a result of a common connection 72 between the drain and gate terminals of the transistor 70. The common connection 72 causes another current mirroring transistor 74 to experience the same conductivity characteristics as the transistor 70, because the gate terminals of the transistor 70 and 74 are commonly connected to the drain terminals of the transistor 68 and 70. As result of the common connection 72, the transistor 74 conducts current from the output terminal 34 to the reference terminal 52 to the same extent that transistor 70 conducts current. Transistor 70 conducts current to the same extent as the conductivity of transistor 68, because of the common connection 72. Transistor 68 conducts current to the same extent as transistor 58, because of the common connection 64.

Thus, the common connections 64 and 72 cause the current mirroring transistors 68, 70 and 74 to conduct current to the output terminal 34 to the same or related extent that the transistor 58 conducts current in one branch of the differential amplifier formed by the transistors 58 and 60, while the common connection 63 causes the current mirroring transistor 66 to conduct current to the output terminal 34 to the same or related extent that the transistor 54 conducts current in the other branch of the differential amplifier formed by the transistors 54 and 56. The current mirroring transistors amplify (according to their size compared to transistors 54 and 58) the current conducted by the branches of the differential amplifier. As a result, the current mirroring transistors 66, 68, 70 and 74 amplify the output current conductivity characteristics at terminal 34 compared to those available from the differential amplifier itself which is formed by transistors 54, 56, 58 and 60.

The added input transistors 36 and 38, and the added current sources 40 and 42 further amplify the current characteristics available from the differential amplifier with respect to the current mirroring transistors. The transistor 36 and its series connected current source 40 are available to drive more current through the mirroring transistor 66 than would otherwise be possible from the differential amplifier itself. When transistor 36 becomes conductive, transistor 56 becomes conductive. The conductivity of transistor 36 further increases the amount of the drive signal on the gate terminals of the transistors 54 and 66, thus causing transistors 66 to conduct more current from the terminal 50 to the output terminal 34. More current is available to drive the mirroring transistor 66. The current source 40, which is separate from the current source 62 of the differential amplifier, provides the additional drive current to the mirroring transistor 66, rather than limiting the amount of drive current to that available from the differential amplifier current source 62. Thus, the separate current source 40 causes and increased conductivity from the mirroring transistor 66 to boost the gain or level of the output signal at the output terminal 34.

In a similar manner, transistor 38 boosts the drive signal applied to the gate terminal of the current mirroring transistor 68. The additional boost current is available from the source 42, thereby avoiding the limited gain effect of the single current source 62 of the differential amplifier. The amplified current conducted by the mirroring transistor 68 is passed through the additional mirroring transistors 70 and 74, to boost the level of the output signal at the output terminal 34.

The enhanced drive effects available from the input transistors 36 and 38 and their separate current sources 40 and 42 thus boosts the level of the output signal at terminal 34. The additional boost is achieved in a very compact (size-wise) manner by the addition of the input transistors 36 and 38, thereby avoiding a considerably larger consumption of space on the IC 12 (FIG. 1) than would be required by the larger and more extensive operational amplifiers and transconductance amplifiers used in some pre-compensation and other equalization circuits. More current is available as a result of the current sources 40 and 42. The current sources 40, 42 and 62 are conventional and typically available within the IC 12 (FIG. 1) as inherent current sources or as a result of external biased sources. These current sources do not consume excessive space on the pad cell circuit, since a conductor extending between the equalization circuit 10 and the current sources is all that is required within the pad cell circuit.

The additional differential current available from the sources 40 and 42 increases the gain or boost characteristics of the equalizer receiver 10. The increased gain characteristics assist in maintaining the output signal closer to its intended level even in the face of the output impedance connected to the output terminal 34. The output impedance connected to the output terminal 34 is, in general, a parallel combination of an inherent capacitance caused by conductors connected to the terminal 34, and by the resistance or impedance of the conductors and other active components connected to the output terminal 34.

The equalization circuit 48 further enhances the levels of the output signals from the output terminal 34 at a predetermined high frequency communication rate. The equalization circuit 48 includes a resistor 76 connected in series with a capacitor 78. A further capacitor 80 is connected in parallel with the series combination of the resistor 76 and capacitor 78. The equalization circuit 48, thus formed, is connected between the source terminals 44 and 46 of the transistors 36 and 38.

The series combination of the resistor 76 and the capacitor 78, to which the capacitor 80 is connected in parallel, is a well-known band pass frequency circuit whose band pass frequency characteristics are readily determined by the values of the capacitors and resistance. Under DC and low frequency conditions, the capacitor 78 and 80 form a relatively high impedance, and there is very little or no effect from the equalization circuit 48 because it is similar to an open circuit between the source nodes 44 and 46. The substantial lack of influence from the equalization circuit 48 at low frequencies is important in achieving a normal and usual response at the lower digital signal communication rates required in older legacy circuitry. However, at high frequencies, the capacitors 78 and 80 present a diminished impedance. The diminished impedance of the equalization circuit 48 causes the current sources 40 and 42 to be connected together thereby increasing the current conductivity capability over that available from either current source 40 or 42 individually. Because of the increased current drain, the amplification available from the transistors 36 and 38 is further increased, thus causing more current to be conducted by the mirroring transistors 66, 68, 70 and 74 to increase the bandwidth of the equalization circuit 10.

Figure 4:
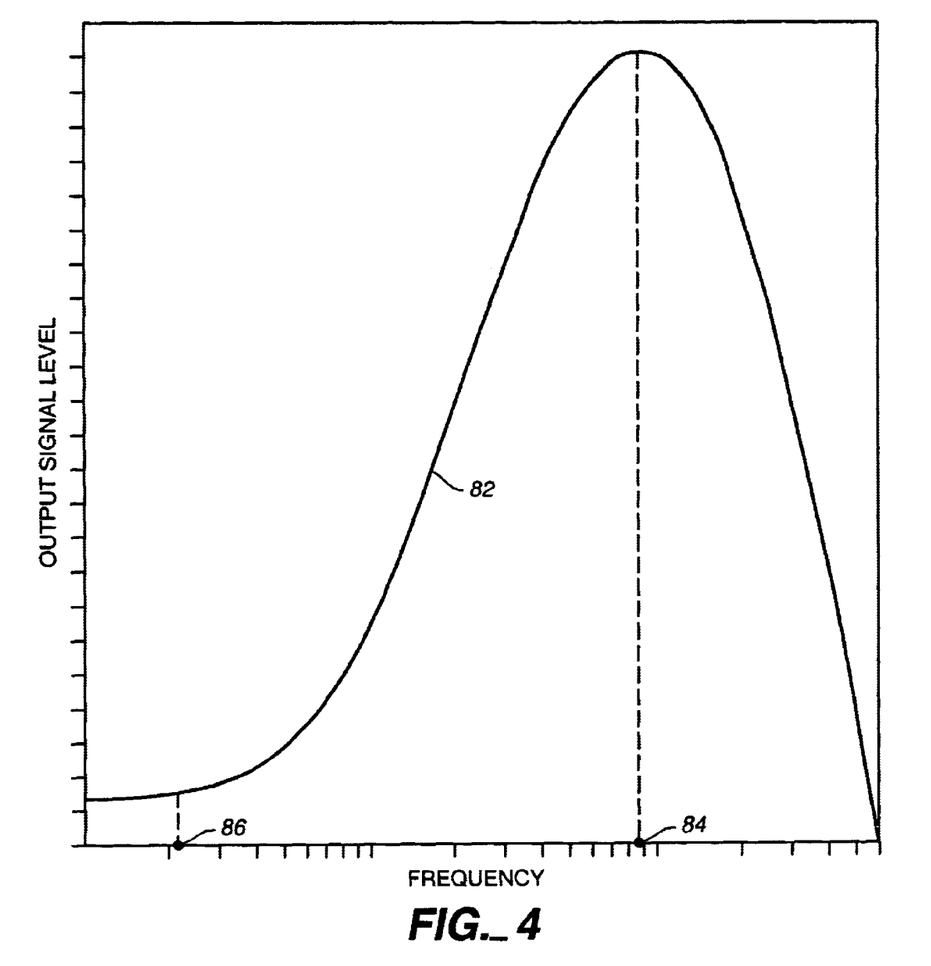
FIG. 4 is a graph of the frequency response and gain characteristics of the equalization receiver circuit shown in FIGS. 2 and 3.

Selecting the component values of the resistor 76 and capacitors 78 and 80 causes a frequency peaking characteristic of the equalization circuit 10 at a predetermined frequency as shown in FIG. 4. Graph 82 represents the level of the output signal from the equalization circuit 10 for a constant differential input signal with respect to variations in the frequency of the constant differential input signal. Graph 82 shows that at a frequency 84, the maximum or peak output signal level is obtained. The peaking effect results because of the tuned frequency transmissive characteristics of the equalization circuit 48. In essence, the equalization circuit 48 achieves a minimum impedance at the frequency 84. The minimum impedance at the frequency 84 results in greater current conductivity from the current sources 40 and 42 which are connected together by the diminished impedance of the equalization circuit 48 at this frequency.

The frequency response characteristics of the equalization circuit 48 are well known and established by conventional linear circuit analysis. The frequency of the peak response (Fp) of the series combination of the resistor 76 and the capacitor 78 is established by the following formula: $Fp=1/(2\pi\, Rz\, C_{78})$. In this formula Rz is an equivalent resistance represented by the sum of the reciprocal of the gain of transistor 36 plus the reciprocal of the gain of transistor 38 plus the resistance of resistor 76. The resistor 76 could be replaced by a metal oxide semiconductor field effect transistor (MOSFET) whose drain-to-source resistance is selectively controlled by the amount of bias signal applied to the gate. Using such a MOSFET as a replacement for the resistor 76 allows a programmable resistance to be inserted in the equalization circuit 48, thus allowing the peaking characteristics of the equalization circuit to be tuned or programmed. Furthermore, by terminating the bias signal to the gate of the MOSFET, the drain-to-source resistance of the MOSFET becomes essentially infinite, thereby essentially disabling the functionality of the series combination of the resistor 76 and the capacitor 78 in the equalization circuit 48. The frequency response characteristics of the parallel connected capacitor 80 are well known, and the capacitor 80 is used to enhance the bandwidth. However, in the case of a non-conductive MOSFET used in substitution for the resistor 76, the effect of the parallel connected capacitor 80 is greatly diminished except at extremely high frequencies.

The frequency response characteristics of the equalization circuit 48 are established by the values of the resistor 76 and the capacitor 78 and 80, which are selected to provide maximum peaking at the frequency 84. The frequency 84 is the desired frequency of the digital communication rate over the SCSI cable 24 (FIG. 1) or other cable interface with the equalization receiver 10. For example, the frequency 84 may be selected at 80 or 160 MHz. The value of the resistance Rz is approximately 500 ohms, the value of the capacitor 78 is approximately 0.2 picofarads, and the value of the capacitor 80 is approximately 0.1 picofarads to achieve a maximum peaking effect at a digital signal communication rate of approximately 80 MHz. These values of the resistance and capacitance are within range which can be achieved from relatively small sized components in the pad cell circuit 12 (FIG. 2), without consuming a relatively large amount of the IC. The overall magnitude of the response shown by the graph 82 (FIG. 4) may be adjusted by adjusting the values of the current sources 40 and 42. On the other hand, at the relatively low digital signal communication rates at which legacy circuits would operate, for example at frequency 86 the graph 82 of FIG. 4 shows that there is a diminished response, thereby causing the equalization receiver 10 to operate in a non-boosted and non-equalized manner with relatively low frequency communication rate legacy equipment.

Because of the relatively high gain and peak frequency response of the equalization receiver 10, it is capable of directly responding to digital signals supplied from a SCSI cable or other cable transmission media, without requiring additional pre-compensation or pre-emphasis driver circuits or equalization circuitry with operational amplifiers connected to each of the channels of the cable. The relatively small size of the equalization receiver 10 makes it feasible for integration into the pad cell circuits of a conventional IC, without requiring the pad cell circuits to be increased substantially in size and to the point where they consume excessive amounts of the surface of the IC to the exclusion of the functional core logic. Moreover, the differential amplifier aspects of the equalization receiver 10 allow it to operate at the power levels and voltage levels within and available from the IC. The frequency response characteristics of the equalization receiver 10 allow it to be used in high frequency communication rate applications, while still providing adequate functionality to accommodate legacy systems which do not operate at relatively high frequencies. Many other advantages and improvements will be apparent once a full comprehension of the various aspects of the present invention is obtained.

A presently preferred embodiment of the invention and its improvements have been described with a degree of particularity. This description has been made by way of preferred example. It should be understood that the scope of the present invention is defined by the following claims, and should not be unnecessarily limited by the detailed description of the preferred embodiment set forth above.

What is claimed is:

1. An equalization receiver responsive to two differentially-related digital input signals occurring at a communication rate of a predetermined frequency, comprising:

a first input device responsive to a first digital input signal and to supply a first drive signal of a magnitude amplified relative to the first digital input signal by a factor related to current conducted by the first input device;

a first current source connected to conduct current through the first input device;

a second input device responsive to a second digital input signal to supply a second drive signal of a magnitude amplified relative to the second digital input signal by a factor related to the current conducted by the second input device;

a second current source connected to conduct current through the second input device, the first and second current sources being separate from one another;

a differential amplifier responsive to first and second drive signals to supply an output signal related to the relative difference in magnitude of the first and second drive signals; and an equalization circuit connected between the first and second current sources, the equalization circuit having a frequency dependent impedance characteristic which exhibits a minimum impedance and a maximum coupling of the first and second current sources for the greatest current conductivity of and the greatest amplification of the relative magnitudes of the first and second drive signals by the first and second input devices at the predetermined frequency, the more amplified relative magnitudes of the first and second drive signals causing the differential amplifier to deliver a more amplified output signal.

2. An equalization receiver as defined in claim 1 which is incorporated in an integrated circuit.

3. An equalization receiver as defined in claim 2 wherein the integrated circuit is for direct connection to a communication cable having a plurality of communication channels, each communication channel formed by a pair of conductors, each pair of conductors supplying the one and the other input signals to the first and second input devices, respectively.

4. An equalization receiver as defined in claim 3 which is incorporated in a pad cell circuit of the integrated circuit.

5. An equalization receiver as defined in claim 1 which is incorporated in a pad cell circuit of an integrated circuit, the pad cell circuit having a pair of signal pads connected to supply the one and the other input signals to the first and second input devices, respectively, the signal pads of the pad cell circuit are for connection directly through intervening connectors to a pair of conductors defining one of a plurality of communication channels of a multichannel signal conducting cable.

6. An equalization receiver as defined in claim 5 wherein the integrated circuit includes a plurality of pad cell circuits having an equalization receiver and a pair of signal pads, and each pair of conductors which defines a channel of the multichannel signal conducing cable is connected to the signal pads of a separate pad cell circuit of the integrated circuit.

7. An equalization receiver as defined in claim 1 which is also responsive to two differentially-related digital input signals occurring at a communication rate of a second predetermined frequency which is different from the predetermined frequency first aforesaid, wherein:

the frequency dependent impedance characteristic of the equalization circuit exhibits a relatively decreased coupling of the first and second current sources to achieve diminished current conductivity and amplification of the relative magnitudes of the first and second drive signals by the first and second input devices at a second predetermined frequency associated with the second drive signal compared to the current conductivity and amplification at a first predetermined frequency associated with the first drive signal, the diminished amplified relative magnitudes of the first and second drive signals at the second predetermined frequency causing the differential amplifier to deliver a diminished output signal at the second predetermined frequency.

8. An equalization receiver as defined in claim 7 which is incorporated in an integrated circuit, and wherein the integrated circuit is for direct connection to a communication cable having a plurality of communication channels, each communication channel formed by a pair of conductors, each pair of conductors supplying the one and the other input signals to the first and second input devices, respectively, and the cable exhibits relatively significant high frequency filtering and attenuation characteristics at the first predetermined frequency and exhibits relatively insignificant high frequency filtering and attenuation characteristics at the second predetermined frequency.

9. An equalization receiver as defined in claim 8 which is incorporated in a pad cell circuit of the integrated circuit.

10. An equalization receiver as defined in claim 9 wherein the integrated circuit includes a plurality of pad cell circuits, each pad cell circuit includes an equalization receiver and pair of signal pads connected to supply the one and the other input signals to the first and second input devices respectively, the signal pads of the pad cell circuit are for connection directly through intervening connectors to the pair of conductors defining one of the plurality of communication channels of the cable, and each pair of conductors which defines a channel of the cable is connected to the signal pads of a separate pad cell circuit of the integrated circuit.

11. An equalization receiver as defined in claim 1 wherein:

a differential amplifier comprises first and second branches and a third current source connected commonly to the first and second branches to conduct current through both of the first and second branches, the third current source being separate from the first and second current sources, each branch having a branch input device and a branch output device, the branch input device of the first branch connected to receive the drive signal from the first input device, the branch input device of the second branch connected to receive the drive signal from the second input device, and the branch output devices of the first and second branches supplying the output signal.

12. An equalization receiver as defined in claim 11 wherein the equalization circuit includes at least one frequency dependant impedance element.

13. An equalization receiver as defined in claim 12 wherein the frequency dependant impedance element comprises a capacitor.

14. An equalization receiver as defined in claim 13 wherein the equalization circuit is defined by at least one capacitor connected to at least one resistive element.

15. An equalization receiver as defined in claim 14 which is incorporated in an integrated circuit, and wherein the first and second input devices, and the branch input sell end output devices of the branches are complementary metal oxide field effect transistors formed in the integrated circuit, and the equalization circuit is also formed in the integrated circuit.

16. An equalization circuit as defined in claim 15, further comprising:

current mirroring complementary metal oxide field effect transistors connected to each of the branch output devices for mirroring current conductivity characteristics of the branch output devices and supplying the output signal.

17. An equalization circuit as defined in claim 16 wherein one current mirroring transistor is diode connected to each branch output device.

18. An equalization circuit as defined in claim 1, further comprising:

current mirroring devices connected to the differential amplifier and receptive of the output signal for conducting current in a mirrored relationship to the output signal from the differential amplifier.

19. A method of boosting and equalizing a response to two differentially-related digital input signals occurring at a communication rate of a predetermined frequency over pair of conductors defining a channel of a multichannel communication cable, comprising the steps of:

supplying a first drive signal derived from one input signal conducted by one conductor of the pair of conductors of the channel of the cable;

amplifying the first drive signal relative to the one input signal by a factor related to a current conducted from a first current source by a first amplifying device;

supplying a second drive signal derived from the other input signal conducted by the other conductor of the pair of conductors of the channel of the cable;

amplifying the second drive signal relative to the other input signal by a factor related to a current conducted from a second current source by a second amplifying device; and coupling the first and second current sources together to achieve a combined current conductivity and the greatest amplification of the relative magnitudes of the first and second drive signals at the predetermined frequency.

20. A method as defined in claim 19 for also communicating a response to the two differentially-related digital input signals occurring at a communication rate of a second predetermined frequency which is different from the predetermined frequency first aforesaid, further comprising the step of:

substantially uncoupling the first and second current sources from one another to limit the current conductivity and the amplification of the relative magnitudes of the first and second drive signals at the second predetermined frequency to limit the current conductivity and the amplification to that which is available separately from each of the first and second current sources.

21. A method as defined in claim 20 further comprising the steps of:

filtering and attenuating the digital signals by communication of the digital signals at a first predetermined frequency over the cable; and communicating the digital signals over the cable without substantial filtering and attenuation at a second predetermined frequency.

22. A method as defined in claim 21 further comprising the steps of:

accomplishing the aforesaid steps by using devices integrated into a complementary metal oxide field effect transistor integrated circuit; and connecting the integrated circuit directly to the cable by intervening direct connections.

23. A method as defined in claim 22 further comprising the step of:

accomplishing the aforesaid steps by using devices confined within a pad cell circuit of the integrated circuit.

24. A method as defined n claim 23 further comprising the steps of:

incorporating a plurality of pad cell circuits in the integrated circuit; and connecting each pair of conductors which a channel of the cable to a different pad cell circuit of the integrated circuit.

* * * * *